US006468717B2

(12) United States Patent
Kita et al.

(10) Patent No.: US 6,468,717 B2
(45) Date of Patent: Oct. 22, 2002

(54) HEAT-SENSITIVE LITHOGRAPHIC PRINTING PLATE PRECURSOR

(75) Inventors: Nobuyuki Kita, Shizuoka (JP); Hisashi Hotta, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/779,616

(22) Filed: Feb. 9, 2001

(65) Prior Publication Data

US 2001/0024766 A1 Sep. 27, 2001

(30) Foreign Application Priority Data

Feb. 24, 2000 (JP) ....................................... 2000-047624

(51) Int. Cl.[7] ............................. G03F 7/11; G03F 7/09; B41C 1/055; B41C 1/501

(52) U.S. Cl. ................................ 430/278.1; 430/276.1; 430/944; 430/159; 430/162; 430/525; 430/526

(58) Field of Search ........................... 430/278.1, 276.1, 430/944, 159, 162, 525, 526

(56) References Cited

U.S. PATENT DOCUMENTS 5,811,215 A * 9/1998 Van Damme et al. ... 430/278.1
6,090,524 A * 7/2000 Deboer et al. ........... 430/272.1
6,140,022 A * 10/2000 Van Damme et al. ... 430/278.1
6,153,353 A * 11/2000 Van Damme et al. ... 430/278.1
6,165,689 A * 12/2000 Vermeersch et al. ..... 430/278.1

* cited by examiner

*Primary Examiner*—Cynthia Hamilton
(74) *Attorney, Agent, or Firm*—Burns, Doane, Swecker & Mathis, LLP

(57) ABSTRACT

A heat-sensitive lithographic printing plate precursor is disclosed, which comprises an aluminum support having provided thereon an ink-receptive layer and a hydrophilic layer containing a colloidal particle oxide or hydroxide of at least one element selected from the group consisting of beryllium, magnesium, aluminum, silicon, titanium, boron, germanium, tin, zirconium, iron, vanadium, antimony and transition metals, wherein at least one layer of the ink-receptive layer and the hydrophilic layer contains a compound capable of converting light into heat, the aluminum support has an anodic oxide film in an amount of 2 $g/m^2$ or more, and the anodic oxide film has been subjected to sealing treatment at a sealing rate of 50% or more.

6 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor which requires no development. More specifically, the present invention relates to a heat-sensitive lithographic printing plate precursor, whose sensitivity is improved, capable of image-recording by infrared ray laser beam scanning exposure based on digital signals, and capable of being directly mounted on a printing machine (i.e., a printing press) without undergoing conventional development processing after image recording to effect printing.

BACKGROUND OF THE INVENTION

Various methods of lithographic printing plate precursors capable of being directly mounted on a printing machine without development processing after exposure and effecting printing have been suggested. One promising method is a method of utilizing ablation, wherein a lithographic printing plate precursor is subjected to exposure with solid state high output infrared ray laser beams such as a semiconductor laser or a YAG laser to make the exposed area generate heat by a compound capable of converting light into heat, to thereby cause cracking evaporation.

That is, this is a method of providing a hydrophilic layer on a lipophilic and ink-receptive surface or on a substrate having a lipophilic and ink-receptive layer and removing the hydrophilic layer by ablation.

For example, a heat-sensitive lithographic printing plate precursor comprising a substrate having coated thereon an ink-receptive layer containing a compound capable of converting light into heat which converts light to heat, and a hydrophilic layer coated thereon containing a colloidal particle oxide or a hydroxide of, e.g., silicon, is disclosed in WO 98/40212.

It is suggested in WO 99/19143 to add a compound capable of converting light into heat not only to an ink-receptive layer but also to a hydrophilic layer. Further, it is disclosed in WO 99/19144 to provide a heat-insulating layer comprising a thermoplastic polymer between a support and a hydrophilic layer.

The purpose of these techniques is, e.g., in the case of WO 98/40212, to improve the problem of the reduction of sensitivity of a heat-sensitive lithographic printing plate precursor resulting by the reduction of the ratio of heat to be used in ablation due to the diffusion of the generated heat to the substrate since a compound capable of converting light into heat is contained in a layer adjacent to a substrate.

However, in particular in the case of using an aluminum plate having high heat conductivity as a support, the influence of heat diffusion to a support is high and the sensitivity of a heat-sensitive lithographic printing plate precursor could not be improved sufficiently satisfactorily even according to the improved techniques disclosed in the above patent specifications.

SUMMARY OF THE INVENTION

Accordingly, an object of the present invention is to solve the above problem. That is, an object of the present invention is to provide a heat-sensitive lithographic printing plate precursor having an aluminum support which can be directly mounted on a printing machine without development processing after exposure to effect printing and is improved in sensitivity.

As a result of eager investigations, the present inventors have found that when an aluminum plate is used as a support, the heat diffusion to a support can be reduced by providing a so-called heat-insulating aerial layer on the surface of the support to seal the pores on the anodic oxide film of the support, thus the above object can be attained.

That is, the present invention has been accomplished by the following means.

(1) A heat-sensitive lithographic printing plate precursor which comprises an aluminum support having provided thereon an ink-receptive layer and a hydrophilic layer containing a colloidal particle oxide or hydroxide of at least one element selected from the group consisting of beryllium, magnesium, aluminum, silicon, titanium, boron, germanium, tin, zirconium, iron, vanadium, antimony and transition metals, wherein at least one layer of the ink-receptive layer and the hydrophilic layer contains a compound capable of converting light into heat, the aluminum support has an anodic oxide film in an amount of 2 $g/m^2$ or more, and the anodic oxide film has been subjected to sealing treatment at a sealing rate of 50% or more.

(2) The heat-sensitive lithographic printing plate precursor which comprises an aluminum support having provided thereon an ink-receptive layer and the hydrophilic layer as described in the above item (1), wherein a water-soluble overcoat layer is further provided over the aluminum support; and at least one layer of the ink-receptive layer, the hydrophilic layer and the water-soluble overcoat layer contains a compound capable of converting light into heat, the aluminum support has an anodic oxide film in an amount of 2 $g/m^2$ or more, and the anodic oxide film has been subjected to sealing treatment at a sealing rate of 50% or more.

DETAILED DESCRIPTION OF THE INVENTION

The embodiments of the present invention will be described in detail below.

An aluminum support for use in the present invention is an aluminum plate having an anodic oxide film of 2 $g/m^2$ or more, and the anodic oxide film has been subjected to sealing treatment of sealing rate of 50% or more.

Conventionally well-known aluminum plates can be arbitrarily used as the raw material aluminum plate of an aluminum support in the present invention. That is, the raw material aluminum plate for use in the present invention is a plate of pure aluminum or an aluminum alloy containing a trace amount of foreign elements with aluminum as a main component. Examples of the foreign elements which may be contained in an aluminum alloy include silicon, iron, manganese, copper, magnesium, chromium, zinc, bismuth, nickel, titanium, etc. As the alloy components, the content of foreign elements is 10 wt % or less. Further, an aluminum plate may be produced from an aluminum ingot by DC casting or an aluminum ingot by continuous casting.

An aluminum substrate for use in the present invention has a thickness of from 0.05 to 0.6 mm, preferably from 0.1 to 0.4 mm, and particularly preferably from 0.15 to 0.3 mm.

It is preferred to subject an aluminum plate to surface roughening treatment prior to anodizing treatment. The surface area of an aluminum plate is increased by the surface roughening treatment, as a result, the adhesion with an upper layer can be improved.

The surface-roughening treatment of the surface of an aluminum plate can be performed by various methods, e.g., mechanical surface-roughening treatment, electrochemical roughening by dissolving the surface, and chemical roughening by selectively dissolving the surface, or two or more of these methods may be combined. As mechanical roughening, well-known methods, e.g., a ball rubbing method, a brush abrading method, a blasting method, or a buffing method, can be used. As chemical roughening, a method of roughening the surface by immersing an aluminum plate in a saturated aqueous solution of the aluminum salt of a mineral acid as disclosed in JP-A-54-31187 (the term "JP-A-" as used herein means an unexamined published Japanese patent application) is suitable. As electrochemical roughening, a method of surface-roughening in an electrolyte containing an acid such as a hydrochloric acid or a nitric acid by alternating current or direct current can be used. Further, electrolytic surface roughening using mixed acids can be used as disclosed in JP-A-54-63902.

These roughening treatments are preferably performed so that the center-line average (surface) roughness (Ra) [defined by JIS B0601] of the surface of an aluminum plate becomes from 0.3 to 1.0 $\mu$m.

The thus surface-roughened aluminum plate is, if required, subjected to alkali etching treatment with an aqueous solution of potassium hydroxide or sodium hydroxide, neutralizing treatment and then to anodizing treatment.

Various electrolytes for forming porous oxide film can be used in the anodizing treatment of an aluminum plate and, in general, sulfuric acid, phosphoric acid, oxalic acid, chromic acid, sulfamic acid, benzenesulfonic acid, and mixed acids of these acids are used. The concentration of these electrolytes are arbitrarily determined according to the kinds of electrolytes.

Anodizing treatment conditions vary according to electrolytes used, hence cannot be specified unconditionally, but in general preferably the concentration of electrolyte is from 1 to 80 wt %, the liquid temperature is from 5 to 70° C., the electric current density is from 5 to 60 A/dm$^2$, the voltage is from 1 to 100 V, electrolytic time is from 10 seconds to 5 minutes.

Of these anodizing treatments, the method of anodizing in sulfuric acid at high electric current density as disclosed in British Patent 1,412,768 and the method of anodizing with phosphoric acid as electrolytic bath as disclosed in U.S. Pat. No. 3,511,661 are particularly preferred.

The amount of the anodic oxide film to be formed of an aluminum support of the present invention is preferably 2.0 g/m$^2$ or more, more preferably from 2.0 to 6.0 g/m$^2$, and particularly preferably from 2.0 to 4.0 g/m$^2$. If the amount of the anodic oxide film is less than 2.0 g/m$^2$, the effect of improving sensitivity is insufficient when sealing treatment is performed.

An aluminum substrate having an anodic oxide film for use in the present invention is subjected to sealing treatment. The sealing rate is preferably 50% or more, more preferably 90% or more. The sealing rate (%) is defined by the following equation.

The sealing rate=100×(the surface area before being sealed−the surface area after being sealed)÷(the surface area before being sealed)

The above surface area is the value measured by a simple BET method QUANTASORB (Yuasa Ionics Co., Ltd.).

Well-known sealing treatments, e.g., hot water treatment, boiling water treatment, water vapor treatment, bichromate treatment, nitrite treatment, ammonium acetate treatment, and electrodeposition sealing treatment, can be applied to the present invention.

Various well-known examples of the methods of hot water treatment, water vapor treatment and boiling water treatment are disclosed, e.g., in JP-A-4-176690 and JP-A-5-131773.

The treatment temperature is generally from 95 to 200° C. or so, preferably from 100 to 150° C. or so, and the treatment time is preferably from 5 to 150 seconds or so at 100° C. and from 1 to 30 seconds or so at 150° C.

As other sealing treatments, fluorozirconate treatment as disclosed in JP-B-36-22063 (the term "JP-B" as used herein means an "examined Japanese patent publication"), or a method of performing treatment with an aqueous solution containing phosphate or an inorganic fluorine compound, as disclosed in JP-A-9-244227 can be used. Alternatively, a method of performing treatment with an aqueous solution containing a sugar as disclosed in JP-A-9-134002 can also be used.

Besides the above methods, a method of performing treatment with an aqueous solution containing titanium and fluorine as disclosed in JP-A-81704/2000 and JP-A-89466/2000 can also be used.

Further, treatment may be performed with alkali metal silicate, and in such a case, the method disclosed in U.S. Pat. No. 3,181,461 can be used.

A sealing treatment method with alkali metal silicate is performed by using an aqueous solution of alkali metal silicate having a pH value of from 10 to 13 at 25° C. which does not cause the gelation of the aqueous solution and the dissolution of the anodic oxide film, and the concentration of alkali metal silicate, and the treatment conditions such as the treatment temperature and the treatment time are arbitrarily selected. Sodium silicate, potassium silicate and lithium silicate can be exemplified as preferred alkali metal silicates.

Further, sodium hydroxide, potassium hydroxide and lithium hydroxide may be used for increasing the pH value of an aqueous solution of alkali metal silicate.

Further, if necessary, an alkaline earth metal salt or a metal salt belonging to group IV-B of the Periodic Table may be added to an aqueous solution of alkali metal silicate. Examples of the alkaline earth metal salts include water-soluble salts such as nitrates, e.g., calcium nitrate, strontium nitrate, magnesium nitrate, and barium nitrate, and sulfate, hydrochloride, phosphate, acetate, oxalate and borate of these alkaline earth metals. Examples of the metal salts belonging to group IV-B of the Periodic Table include titanium tetrachloride, titanium trichloride, potassium titanium fluoride, potassium titanium oxalate, titanium sulfate, titanium, tetraiodide, zirconium oxide chloride, zirconium dioxide, zirconium oxychloride, and zirconium tetrachloride. An alkaline earth metal salt or a metal salt belonging to group IV-B of the Periodic Table may be used alone or in combination of two or more thereof. The preferred use amount of these metal salts used is from 0.01 to 10 wt %, more preferably from 0.05 to 5.0 wt %.

An ink-receptive layer according to the present invention contains an organic high polymer. The organic high polymers to be used in the present invention are those which are soluble in a solvent and capable of forming a lipophilic film. Further, these organic high polymers are preferably insoluble in the coating solvent of the upper hydrophilic layer, but sometimes it is preferred that the organic high polymers are partially swollen in the coating solvent of the upper hydrophilic layer in view of the adhesion with the hydrophilic layer. Moreover, when organic high polymers which are soluble in the coating solvent of the upper layer are used, it is preferred to contrive to add a crosslinking agent and so on to harden the ink-receptive layer in advance.

Examples of useful organic high polymers for use in the present invention include polyester, polyurethane, polyurea, polyimide, polysiloxane, polycarbonate, a phenoxy resin, an epoxy resin, a novolak resin, a resol resin, a condensation resin of a phenol compound with acetone, polyvinyl acetate, an acrylate resin and copolymers thereof, polyvinylphenol, polyvinyl halogenated phenol, a methacrylate resin and copolymers thereof, an acrylamide copolymer, a methacrylamide copolymer, polyvinyl formal, polyamide, polyvinyl butyral, polystyrene, a cellulose ester resin, polyvinyl chloride and polyvinylidene chloride.

Of these organic high polymers, resins having a hydroxyl group, a carboxyl group, a sulfonamido group or a trialkoxysilyl group as the side chain are more preferred because they are excellent in adhesion with the substrate and the upper hydrophilic layer and in some cases they are easily hardened with a crosslinking agent.

Besides these compounds, acrylonitrile copolymers, polyurethane, copolymers having a sulfonamido group as the side chain and copolymers having a hydroxyl group as the side chain photo-set with a diazo resin are preferably used.

As the novolak resins and the resol resins, the addition condensation products of phenol, cresol (m-cresol, p-cresol, m/p mixed cresol), phenol/cresol (m-cresol, p-cresol, m/p mixed cresol), phenol-modified xylene, t-butylphenol, octylphenol, resorcinol, pyrogallol, catechol, chlorophenol (m-Cl, p-Cl), bromophenol (m-Br, p-Br), salicylic acid and fluoroglucinol, with formaldehyde, e.g., formaldehyde and paraformaldehyde, can be exemplified.

As other preferred high polymer compounds, copolymers having the monomers shown in (1) to (12) below as repeating units and having molecular weight of generally from 10,000 to 200,000 can be exemplified.

(1) Acrylamides, methacrylamides, acrylates, methacrylates, and hydroxystyrenes, each of which has an aromatic hydroxyl group, e.g., N-(4-hydroxyphenyl) acrylamide, N-(4-hydroxy-phenyl)methacrylamide, o-, m- and p-hydroxystyrene, o-, m- and p-hydroxyphenyl acrylate or methacrylate;

(2) Acrylates and methacrylates each having an aliphatic hydroxyl group, e.g., 2-hydroxyethyl acrylate, or 2-hydroxyethyl methacrylate;

(3) Acrylates, e.g., methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N,N-dimethylaminoethyl acrylate, etc.;

(4) Methacrylates, e.g., methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N,N-dimethylaminoethyl methacrylate, etc.;

(5) Acrylamides or methacrylamides, e.g., acrylamide, methacrylamide, N-methylolacrylamide, N-methylolmethacryl-amide, N-ethylacrylamide, N-ethylmethacrylamide, N-hexyl-acrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenyl-methacrylamide, N-benzylacrylamide, N-benzylmethacrylamide, N-nitrophenylacrylamide, N-nitrophenylmethacrylamide, N-ethyl-N-phenylacrylamide, N-ethyl-N-phenylmethacrylamide, etc.;

(6) Vinyl ethers, e.g., ethyl vinyl ether, 2-chloroethyl vinyl ether, hydroxyethyl vinyl ether, propyl vinyl ether, butyl vinyl ether, octyl vinyl ether, phenyl vinyl ether, etc.;

(7) Vinyl esters, e.g., vinyl acetate, vinyl chloroacetate, vinyl butyrate, vinyl benzoate, etc.;

(8) Styrenes, e.g., styrene, methylstyrene, chloromethylstyrene, etc.;

(9) Vinyl ketones, e.g., methyl vinyl ketone, ethyl vinyl ketone, propyl vinyl ketone, phenyl vinyl ketone, etc.;

(10) Olefins, e.g., ethylene, propylene, isobutylene, butadiene, isoprene, etc.;

(11) N-vinylpyrrolidone, N-vinylcarbazole, 4-vinylpyridine, acrylonitrile, methacrylonitrile, etc.;

(12) Acrylamides and methacrylamide containing a sulfonamido group, e.g., N-(o-aminosulfonylphenyl) acrylamide, N-(m-aminosulfonylphenyl)acrylamide, N-(p-aminosulfonylphenyl)acrylamide, N-[1-(3-aminosulfonyl) naphthyl]acrylamide, N-(2-amino-sulfonylethyl) acrylamide, N-(o-aminosulfonylphenyl)-methacrylamide, N-(m-aminosulfonylphenyl)methacrylamide, N-(p-aminosulfonylphenyl)methacrylamide, N-[1-(3-amino-sulfonyl)naphthyl]methacrylamide, N-(2-aminosulfonylethyl)-methacrylamide, etc.; and acrylates or methacrylates, containing a sulfonamido group, e.g., o-aminosulfonylphenyl acrylate, m-aminosulfonylphenyl acrylate, p-aminosulfonyl-phenyl acrylate, 1-(3-aminosulfonylphenylnaphthyl) acrylate, o-aminosulfonylphenyl methacrylate, m-aminosulfonylphenyl methacrylate, p-aminosulfonylphenyl methacrylate, 1-(3-aminosulfonylphenylnaphthyl) methacrylate, etc.

The ink-receptive layer can be provided by dissolving these organic high polymers in an appropriate solvent and coating them on a substrate and drying. Organic high polymers may be dissolved in a solvent alone but, if necessary, a crosslinking agent, an auxiliary adhesive, a coloring agent, inorganic or organic fine particles, a coating surface improving agent, or a plasticizer can be added.

In addition, a colorant by heating or a decolorant for forming printout images after exposure may be added to the ink-receptive layer.

Examples of the crosslinking agents for crosslinking organic high polymers include diazo resins, aromatic azido compounds, epoxy resins, isocyanate compounds, block isocyanate compounds, initial hydrolysis condensation product of tetraalkoxyl silicon, glyoxal, aldehyde compounds and methylol compounds.

As auxiliary adhesives, the above-described diazo resins are superior in adhesion with the substrate and the hydrophilic layer, in addition, silane coupling agents, isocyanate compounds, titanium coupling agents are also useful.

Ordinarily used dyes and pigments are used as the coloring agents in the present invention, and preferred examples include Rhodamine 6G chloride, Rhodamine B chloride, Crystal Violet, Malachite Green oxalate, quinizarin, and 2-(α-naphthyl)-5-phenyloxazole. As other dyes, specific examples include triphenylmethane-based, diphenylmethane-based, oxazine-based, xanthene-based, iminonaphthoquinone-based, azomethine-based, and anthraquinone-based dyes represented by Oil Yellow #101, Oil Yellow #103, Oil Pink #312, Oil Green BG, Oil Blue BOS, Oil Blue #603, Oil Black BY, Oil Black BS, Oil Black T-505 (manufactured by Orient Chemical Industry Co., Ltd.), Victoria Pure Blue, Crystal Violet (C.I. 42555), Methyl Violet (C.I. 42535), Ethyl Violet, Methylene Blue (C.I. 52015), Patent Pure Blue (manufactured by Sumitomo Mikuni Chemical Co., Ltd.), Brilliant Blue, Methyl Green, Erythrisine B, Basic Fuchsine, m-Cresol Purple, Auramine, 4-p-diethylaminophenyliminonaphthoquinone, and cyano-p-diethylaminophenyl acetanilide, and the dyes disclosed in JP-A-62-293247 and JP-A-9-179290.

When these dyes are added to the ink-receptive layer, the amount of the dyes is generally preferably from about 0.02 to about 10 wt %, more preferably from about 0.1 to about 5 wt %, based on the entire solid contents of the ink-receptive layer.

Further, fluorine-based surfactants and silicon-based surfactants which are well known as coating surface improving agents can also be used. Specifically, surfactants having a perfluoroalkyl group or a dimethylsiloxane group are useful as they can adjust the coating surface.

As the inorganic or organic fine particles which can be used in the present invention, colloidal silica and colloidal aluminum having a particle size of from 10 to 100 nm, inert particles having a larger particle size than the above colloids, e.g., silica particles, surface-hydrophobitized silica particles, alumina particles, titanium dioxide particles, other heavy metallic particles, clay and talc can be exemplified. Due to the addition of these inorganic or organic fine particles to the ink-receptive layer, the adhesive property of the ink-receptive layer with the upper hydrophilic layer can be improved and impression capacity in printing can be increased. The proportion of these fine particles in the ink-receptive layer is preferably 80 wt % or less, more preferably 40 wt % or less, based on the entire solid contents of the ink-receptive layer.

Plasticizers are added to the ink-receptive layer according to the present invention for giving flexibility to the film, if necessary. As such plasticizers, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, etc., are used.

Further, as the coloring or decoloring additives which can be added to the ink-receptive layer according to the present invention, for example, heat-acid generating agents such as diazo compounds and dephenyl iodonium salts are used together with leuco dyes (Leuco Malachite Green, Leuco Crystal Violet, and lactone body of Crystal Violet, etc.) and pH colorings dyes (e.g., Ethyl Violet, Victoria Pure Blue BOH, etc.). Further, the conbination of acid-coloring dyes with acidic binders as disclosed in EP 897134 is also useful. In this case, the bonding of the associated condition forming a dye is cut by heating and colored state changes to colorless state.

The proportion of these colorants in the ink-receptive layer is preferably 10 wt % or less, more preferably 5 wt % or less, based on the solid contents of the ink-receptive layer.

As the solvent for use in the coating solution of the above ink-receptive layer, alcohols (e.g., methanol, ethanol, propyl alcohol, ethylene glycol, diethylene glycol, propylene glycol, dipropylene glycol, ethylene glycol monomethyl ether, propylene glycol monomethyl ether, ethylene glycol monoethyl ether, etc.), ethers (e.g., tetrahydrofuran, ethylene glycol dimethyl ether, propylene glycol dimethyl ether, tetrahydropyran, etc.), ketones (e.g., acetone, methyl ethyl ketone, acetylacetone, etc.), esters (e.g., methyl acetate, ethyl acetate, ethylene glycol monomethyl ether monoacetate, γ-butyrolactone, methyl lactate, ethyl lactate, etc.), amides (e.g., formamide, N-methylformamide, pyrrolidone, N-methyl-pyrrolidone, etc.), can be used. These solvents are used alone or as mixture. The concentration of the components of the ink-receptive layer (the entire solid contents inclusive of the additives) in a solvent is preferably from 1 to 50 wt %. The film can be formed not only by coating from the organic solvent but also from aqueous emulsion. In this case, the concentration of the components of the ink-receptive layer is preferably from 5 wt % to 50 wt %.

The dry coating thickness of the ink-receptive layer according to the present invention is 0.1 μm or more, preferably 0.5 μm or more, since the ink-receptive layer also functions as a heat-insulating layer. If the thickness of the ink-receptive layer is too thin, the generated heat is diffused to the aluminum substrate and thereby the sensitivity lowers, further, abrasion resistance is reduced and impression capacity cannot be ensured.

The hydrophilic layer for use in the present invention contains a colloidal particle oxide or hydroxide of at least one element selected from beryllium, magnesium, aluminum, silicon, titanium, boron, germanium, tin, zirconium, iron, vanadium, antimony and transition metals.

The colloidal particle oxide and hydroxide of these elements are produced as the dispersion phases of colloidal dispersion solutions, i.e., colloidal particles, by various methods such as hydrolysis of the halides and the alkoxyl compounds of the above elements and condensation of the hydroxides of the above elements. When they are added to the coating solution for forming a hydrophilic layer, they can be added as the state of colloidal dispersion solutions.

Of the oxides and hydroxides of these elements, particularly preferred are the oxide or hydroxide of at least one element selected from aluminum, silicon, titanium and zirconium.

As the colloid particle size of the oxide or hydroxide of these elements, spherical particles having a particle diameter of from 5 to 100 nm are preferably used in the case of silica in the present invention. Pearl necklace-like colloids in which spherical particles having particle diameters of from 10 to 50 nm lie in a row in a length of from 50 to 400 nm can also be used. Further, plumy colloidal particles of 100 nm×10 nm such as aluminum oxides and hydroxides are also effectively used.

These colloidal dispersion solutions are available from Nissan Chemical Industries, Ltd.

Organic solvents such as methanol, ethanol, ethylene glycol monomethyl ether, and methyl ethyl ketone as well as water are useful as the dispersion medium of these colloidal particles.

Hydrophilic resins can be used in the hydrophilic layer according to the present invention together with the above colloidal particles. Due to the use of hydrophilic resins, the film property of the hydrophilic layer is strengthened and the press life can be improved.

As the hydrophilic resins for use in the present invention, resins having a hydrophilic group, e.g., hydroxyl, carboxyl, hydroxyethyl, hydroxypropyl, amino, aminoethyl, aminopropyl, and carboxymethyl are preferred.

Specific examples of the hydrophilic resins include gum arabic, casein, gelatin, starch derivatives, carboxymethyl cellulose, and sodium salts thereof, cellulose acetate, sodium alginate, vinyl acetate-maleic acid copolymers, styrene-maleic acid copolymers, polyacrylic acid and salts thereof, polymethacrylic acid and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycol, polypropylene oxide, polyvinyl alcohol, hydrolyzed polyvinyl acetate having a hydrolysis degree of at least 60 wt %, preferably at least 80 wt %, polyvinyl formal, polyvinyl butyral, polyvinyl pyrrolidone, homopolymers and copolymers of acrylamide, homopolymers and copolymers of methacrylamide, and homopolymers and copolymers of N-methylolacrylamide.

Particularly preferred hydrophilic resins are polymers containing a water-insoluble hydroxyl group, specifically homopolymers and copolymers of hydroxyethyl methacrylate and copolymers of hydroxyethyl acrylate.

The proportion of the addition amount of these hydrophilic resins is preferably 40 wt % or less when the hydrophilic resins are soluble in water, and preferably 20 wt % or less when the hydrophilic resins are insoluble in water, each based on the solid contents of the hydrophilic layer.

The hydrophilic layer of the present invention can contain a resin having an aromatic hydroxyl group. Due to the addition of the resin having an aromatic hydroxyl group, the film property of the hydrophilic layer is strengthened and the ink adhesion of the start of printing can be improved.

As the resin having an aromatic hydroxyl group, those which are soluble in methanol in a weight of 5 wt % or more at 25° C. are preferred, and alkali-soluble resins, e.g., a novolak resin, a resol resin, a polyvinylphenol resin, a ketone pyrogallol resin, etc., can be exemplified.

As the preferred novolak resins, novolak resins obtained by addition condensation of at least one hydroxyl group-containing aromatic compound selected from the group consisting of phenol, o-cresol, m-cresol, p-cresol, 2,5-xylenol, 3,5-xylenol and resorcin with at least one selected from aldehydes such as formaldehyde, acetaldehyde and propionaldehyde in the presence of an acid catalyst can be exemplified. Paraformaldehyde and paraldehyde may be used in place of formaldehyde and acetaldehyde respectively.

Novolak resins which are the addition condensation products of the mixture of m-cresol/p-cresol/2,5-xylenol/3,5-xylenol/resorcin of the mixing rate in molar ratio of from 40 to 100/from 0 to 50/from 0 to 20/from 0 to 20/from 0 to 20 with aldehyde, and the mixture of phenol/m-cresol/p-cresol of the mixing rate in molar ratio of from 1 to 100/from 0 to 70/from 0 to 60 with aldehyde are preferred. Formaldehyde is particularly preferred of aldehydes.

The novolak resins preferably used in the present invention have a weight average molecular weight in terms of polystyrene of preferably from 1,000 to 15,000, more preferably from 1,500 to 10,000, according to the measurement by gel permeation chromatography (hereinafter abbreviated to GPC).

As preferred resol resins, resol resins obtained by addition condensation of at least one of hydroxyl group-containing aromatic hydrocarbons selected from the group consisting of phenol, m-cresol, o-cresol, p-cresol, 2,5-xylenol, 3,5-xylenol, resorcin, pyrogallol, bis(4-hydroxy-phenyl) methane, bisphenol-A, o-ethylphenol, m-ethylphenol, p-ethylphenol, propylphenol, n-butylphenol, t-butylphenol, 1-naphthol, and 2-naphthol, or at least one of other polynuclear aromatic hydrocarbons having two or more hydroxyl groups, with at least one aldehyde or ketone selected from formaldehyde, acetaldehyde, propionaldehyde, benzaldehyde and furfural, or acetone, methyl ethyl ketone, and methyl isobutyl ketone, in the presence of an alkali catalyst can be exemplified.

Paraformaldehyde and paraldehyde may be used in place of formaldehyde and acetaldehyde respectively. The resol resins have a weight average molecular weight of preferably from 500 to 10,000, particularly preferably from 1,000 to 5,000.

Examples of preferred polyvinylphenol resins include homopolymers or copolymers of at least one of hydroxystyrenes such as o-hydroxystyrene, m-hydroxystyrene, p-hydroxystyrene, 2-(o-hydroxyphenyl)propylene, 2-(m-hydroxyphenyl)propylene, and 2-(p-hydroxyphenyl) propylene. The hydroxystyrenes may have a halogen, e.g., chlorine, bromine or iodine, or a substituent, e.g., an alkyl group having from 1 to 4 carbon atoms in the aromatic rings. Therefore, as the polyvinylphenols, polyvinylphenols which may have a halogen or an alkyl group having from 1 to 4 carbon atoms in the aromatic rings can be exemplified.

In addition, the copolymerized products of hydroxystyrenes such as o-hydroxystyrene, m-hydroxystyrene, p-hydroxystyrene, 2-(o-hydroxyphenyl)propylene, 2-(m-hydroxy-phenyl)propylene, and 2-(p-hydroxyphenyl) propylene with methacrylic acid, acrylic acid, alkyl methacrylate or alkyl acrylate are also useful.

Polyvinylphenol resins are generally obtained by polymerizing one or two or more of hydroxystyrenes which may have a substituent in the presence of a radical polymerization initiator or a cationic polymerization initiator. Such polyvinylphenol resins may be partially hydrogenated. The hydroxyl groups of polyvinylphenol resins may be partially protected with a t-butoxycarbonyl group, a pyranyl group, or a furanyl group. Polyvinylphenol resins have a weight average molecular weight of preferably from 1,000 to 100,000, particularly preferably from 1,500 to 50,000.

As the ketone pyrogallol resins, acetone pyrogallol resins are particularly useful.

The addition rate of these resins having an aromatic hydroxyl group is from 1 to 20 wt %, preferably from 3 to 12 wt %, based on the solid contents of the hydrophilic layer.

In addition to the colloidal particle oxides or hydroxides of the above-described elements and the resins having an aromatic hydroxyl group, the hydrophilic layer according to the present invention may contain a crosslinking agent for accelerating the crosslinking of the colloidal particle oxide or hydroxide. As such a crosslinking agent, the initial hydrolytic condensation product of tetraalkoxysilane, trialkoxysilylpropyl-N,N,N-trialkylammonium halide and aminopropyltrialkoxysilane are preferably used. The addition rate of the crosslinking agent is preferably 5 wt % or less of the solid contents of the hydrophilic layer.

Further, the hydrophilic layer of the present invention may contain crosslinking agents for the above-described hydrophilic resins or the resins containing an aromatic hydroxyl group for the purpose of improving the impression capacity in printing. As such crosslinking agents, formaldehyde, glyoxal, polyisocyanate, the initial hydrolytic condensation product of tetraalkoxysilane, dimethylolurea and hexamethylolmelamine can be exemplified.

Moreover, the hydrophilic layer of the present invention may contain well-known fluorine-based surfactants, silicon-based surfactants, polyoxyethylene-based surfactants, etc., for the purpose of improving the coating surface conditions.

The coating thickness of the hydrophilic layer according to the present invention is preferably from 0.1 to 3 μm, more preferably from 0.5 to 2 μm. The durability of the hydrophilic layer and excellent press life in printing can be ensured with the thickness within this range.

When imaging is performed with a commercially available general semiconductor laser, a thickness of about 0.5 μm requires energy of from 250 to 400 $mJ/cm^2$ and a thickness of about 1.5 μm requires energy of from 350 to 500 $mJ/cm^2$. Hence, if the layer is too thick, a large quantity of energy is required to peel off the hydrophilic layer from the ink-receptive layer by ablation, and long imaging time is necessary in laser exposure, as a result, the productivity of producing the printing plate is lowered.

A water-soluble overcoat layer may be provided on the hydrophilic layer of the heat-sensitive lithographic printing plate precursor of the present invention. By the provision of the overcoat layer, the scattering of scum (e.g., chips) due to ablation can be inhibited and the hydrophilic layer can be prevented from being stained by lipophilic substances during the storing or handling of the printing plate precursor. Further, by the incorporation of a compound capable of converting light into heat into the overcoat layer, the deterioration of the quality of the hydrophilic layer due to a compound capable of converting light into heat can be prevented.

The water-soluble overcoat layer for use in the present invention can be easily removed at printing and contains resins selected from water-soluble high polymer compounds. The water-soluble high molecular compounds should have film-forming property by coating and drying. Specific examples of such high molecular compounds include polyvinyl acetate (having hydrolysis factor of 65% or more), polyacrylic acid and alkali metal salts or amine salts thereof, acrylic acid copolymers and alkali metal salts or amine salts thereof, polymethacrylic acid and alkali metal salts or amine salts thereof, methacrylic acid copolymers and alkali metal salts or amine salts thereof, homopolymers and copolymers of acrylamide, polyhydroxyethyl acrylate, homopolymers and copolymers of vinyl pyrrolidone, polyvinyl methyl ether, vinyl methyl ether/maleic anhydride copolymers, poly-2-acrylamide-2-methyl-1-propanesulfonic acid and alkali metal salts or amine salts thereof, 2-acrylamide-2-methyl-1-propanesulfonic acid copolymers and alkalimetal salts oramine salts thereof, gum arabic, cellulose derivatives (e.g., carboxymethyl cellulose, carboxyethyl cellulose, methyl cellulose, etc.) and modified products thereof, white dextrin, pullulan, and enzyme-decomposed etherified dextrin. These resins may be used as mixture of two or more kinds according to purposes.

In addition, nonionic surfactants can be added to the overcoat layer in the case of coating an aqueous solution for the purpose of ensuring coating uniformity. As such nonionic surfactants, sorbitan tristearate, sorbitan monopalmitate, sorbitan trioleate, stearic acid monoglyceride, polyoxyethylenenonylphenyl ether, and polyoxyethylenedodecyl ether can be exemplified.

The proportion of the nonionic surfactants in the entire solid contents of the overcoat layer is preferably from 0.05 to 5 wt %, more preferably from 1 to 3 wt %.

The thickness of the overcoat layer according to the present invention is preferably from 0.05 to 4.0 $\mu$m, more preferably from 0.1 to 1.0 $\mu$m. When the thickness of the overcoat layer falls within this range, the scattering of scum due to ablation can be inhibited and the hydrophilic layer can be prevented from being stained by lipophilic substances without impairing film properties and causing harmful influences such that the removal of the overcoat layer takes longer time at printing, a water-soluble resin dissolved in a large amount influences a fountain solution and causes roller strip or ink does not adhere to the image area.

At least one of an ink-receptive layer, a hydrophilic layer and an overcoat layer of the present invention contains a compound capable of converting light into heat having the function of converting light to heat for the purpose of increasing sensitivity. Substances having absorption band at at least a part of the wavelength of from 700 nm to 1,300 nm may be sufficient for this purpose, and various pigments and dyes can be used as the compounds capable of converting light into heat.

As such pigments, commercially available pigments and the infrared ray-absorbing pigments described in *Color Index* (*C. I.*) *Binran* (*Color Index* (*C.I.*) *Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Applied Techniques of Pigments*), published by CMC Publishing Co. Ltd. (1986), and *Insatsu Ink Gijutsu* (*Printing Ink Techniques*), CMC Publishing Co. Ltd. (1984) can be used.

These pigments may be surface-treated by well-known surface treatment methods as required for improving the dispersibility in a layer to be added. As methods of surface treatments, a method of surface-coating with hydrophilic resins and lipophilic resins, a method of adhering surfactants, and a method of bonding reactive substances (e.g., silica sol, alumina sol, silane coupling agents, epoxy compounds, isocyanate compounds, etc.) on the surfaces of pigments can be exemplified.

The pigments to be added to a hydrophilic layer are preferably surface-coated with hydrophilic resins or silica sol in particular so as to be dispersed with water-soluble resins and not to impair the hydrophilic property. The particle size of the pigments is preferably from 0.01 to 1 $\mu$m, more preferably from 0.01 to 0.5 $\mu$m. Well-known dispersing methods used in manufacturing inks and toners can be used as dispersing methods of pigments.

Of pigments, carbon black can be exemplified as a particularly preferred pigment.

As the dyes for this purpose, those commercially available and well-known dyes described, for example, described in *Senryo Binran* (*Dye Handbook*), compiled by Yuki Gosei Kagaku Kyokai (1970), "Kin-Sekigai Kyushu Shikiso (*Near Infrared Ray Absorbing Dyes*)" in *Kagaku Kogyo* (*Chemical Industry*), pp. 45 to 51 (May, 1986), 90 *Nen-dai Kinosei Shikiso no Kaihatsu to Shijo Doko* (*Development and Market Trend of Functional Dyes in the Nineties*), Item 2.3, Chapter 2, CMC Publishing Co. Ltd. (1990), or various patent specifications can be utilized. Specifically, infrared ray-absorbing dyes, e.g., azo dyes, metal complex azo dyes, pyrazolone azo dyes, anthraquinone dyes, phthalocyanine dyes, carbonium dyes, quinoneimine dyes, polymethine dyes, and cyanine dyes are preferably used.

Further, as the dyes for use as the compound capable of converting light into heat, e.g., the cyanine dyes disclosed in JP-A-58-125246, JP-A-59-84356, and JP-A-60-78787, the methine dyes disclosed in JP-A-58-173696, JP-A-58-181690, and JP-A-58-194595, the naphthoquinone dyes disclosed in JP-A-58-112793, JP-A-58-224793, JP-A-59-48187, JP-A-59-73996, JP-A-60-52940, and JP-A-60-63744, the squarylium dyes disclosed in JP-A-58-112792, the cyanine dyes disclosed in British Patent 434,875, the dyes disclosed in U.S. Pat. No. 4,756,993, the cyanine dyes disclosed in U.S. Pat. No. 4,973,572, and the dyes disclosed in JP-A-10-268512 can be exemplified.

Further, the near infrared-absorbing sensitizing dyes disclosed in U.S. Pat. No. 5,156,938 are also preferably used. In addition, the substituted arylbenzo(thio)pyrylium salts disclosed in U.S. Pat. No. 3,881,924, the trimethine thiapyrylium salts disclosed in JP-A-57-142645 (corresponding to U.S. Pat. No. 4,327,169), the pyrylium-based compounds disclosed in JP-A-58-181051, JP-A-58-220143, JP-A-59-41363, JP-A-59-84248, JP-A-59-84249, JP-A-59-146063, and JP-A-59-146061, the cyanine dyes disclosed in JP-A-59-216146, the pentamethine thiopyrylium salts disclosed in U.S. Pat. No. 4,283,475, the pyrylium compounds disclosed in JP-B-5-13514 and JP-B-5-19702, Epolite III-178, Epolite III-130, and Epolite III-125 (manufactured by Epoline Co., Ltd.) are also particularly preferably used.

Of these dyes, water-soluble dyes are particularly preferably used in an overcoat layer and a hydrophilic layer and specific examples are shown below by structural formulae.

(IR-1)
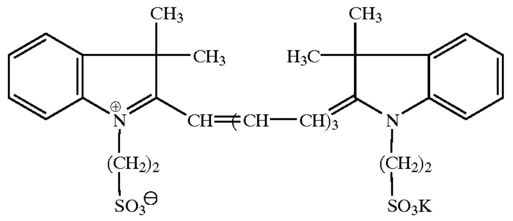
(IR-2)
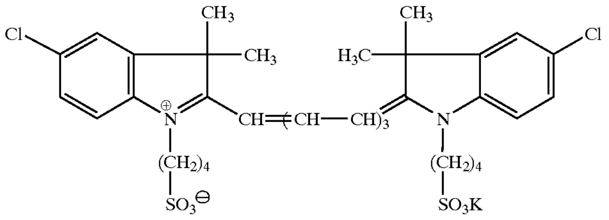
(IR-3)
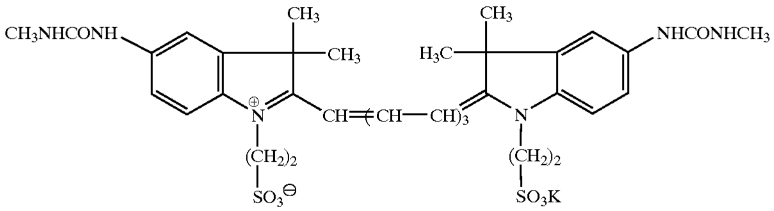
(IR-4)
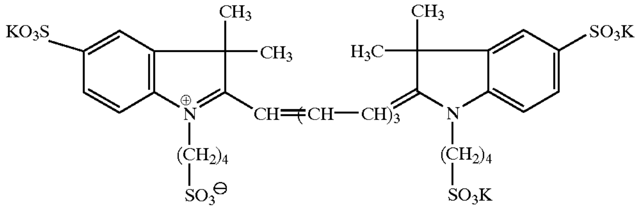
(IR-5)
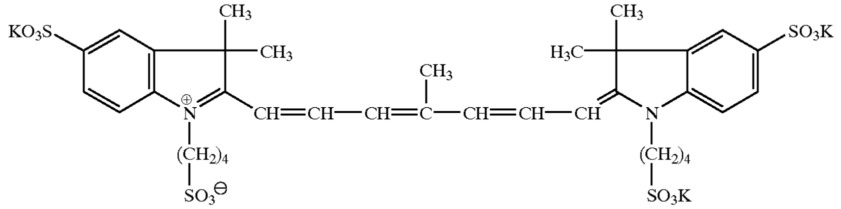
(IR-6)
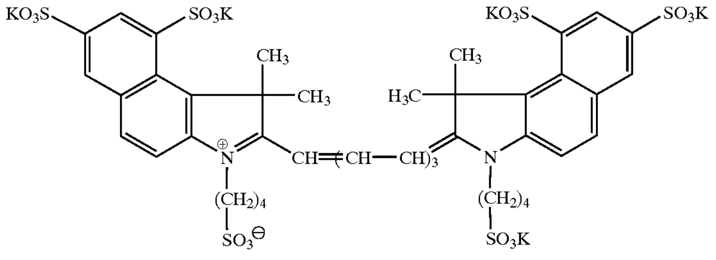
(IR-7)
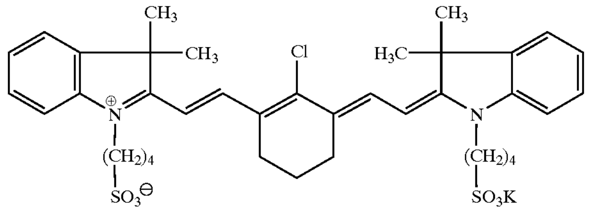

-continued
(IR-8)
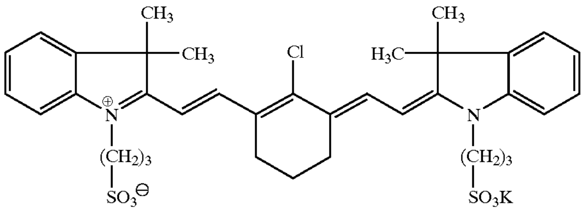
(IR-9)
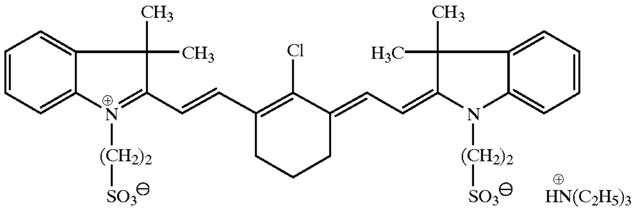
(IR-10)
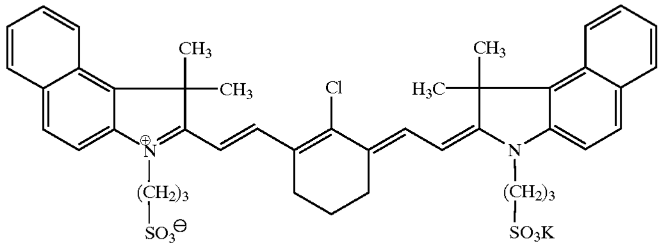
(IR-11)
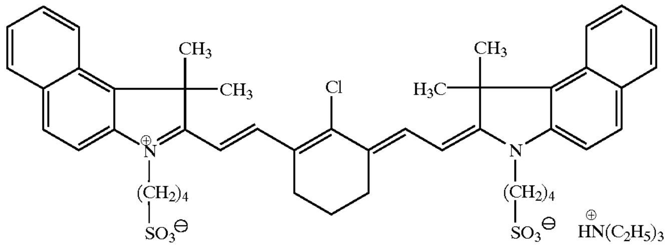
The dyes for use in an ink-receptive layer according to the present invention may be the above-described infrared ray-absorbing dyes but lipophilic dyes are preferably used. The following cyanine dyes can be exemplified as preferred examples.
(IR-21)
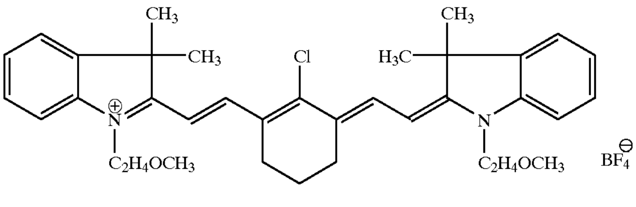
(IR-22)
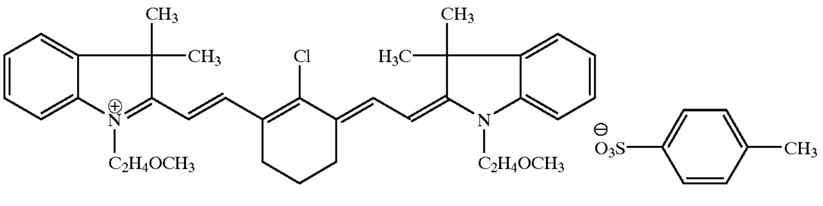

-continued (IR-23)

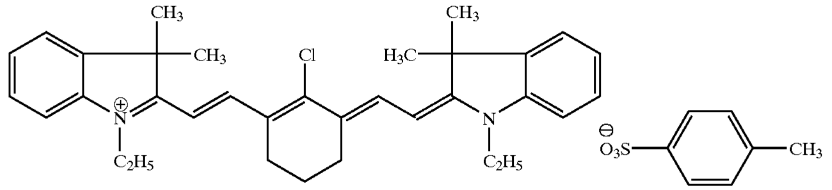

(IR-24)

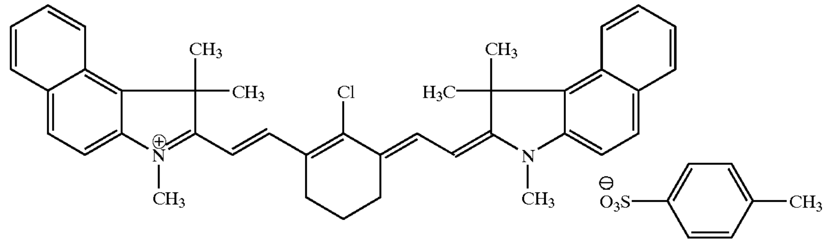

(IR-25)

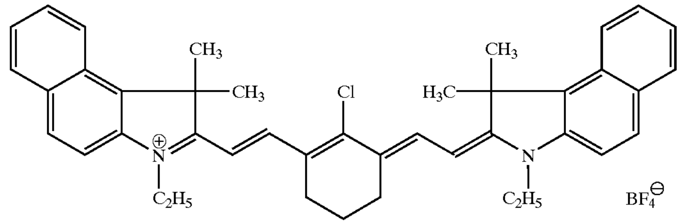

When a compound capable of converting light into heat is added to an ink-receptive layer, the addition rate of the compound capable of converting light into heat is preferably 20 wt % or less, more preferably 15 wt % or less, of the solid contents in the ink-receptive layer. In this range of the addition amount of a compound capable of converting light into heat, good heat sensitivity can be obtained without impairing the durability of the ink-receptive layer.

When a compound capable of converting light into heat is added to a hydrophilic layer, the addition rate of the compound capable of converting light into heat is from 1 to 40 wt %, preferably from 2 to 20 wt %, of the solid contents in the hydrophilic layer. In this range of the addition amount of a compound capable of converting light into heat, good heat sensitivity can be obtained without impairing the hydrophilic property and the durability of the hydrophilic layer.

When a compound capable of converting light into heat is added to an overcoat layer, the addition rate of the compound capable of converting light into heat is from 1 to 70 wt %, preferably from 2 to 50 wt %, of the solid contents in the overcoat layer. When the compound capable of converting light into heat is a dye, the addition rate is particularly preferably from 2 to 30 wt %, and when the compound capable of converting light into heat is a pigment, the addition rate is particularly preferably from 20 to 50 wt %. In this range of the addition amount of a compound capable of converting light into heat, good heat sensitivity can be obtained without impairing the uniformity and the film strength of the overcoat layer.

When a compound capable of converting light into heat is added to an overcoat layer, the addition amounts to an ink-receptive layer and a hydrophilic layer can be reduced according to the amount in the overcoat layer, or may not be added at all.

An image is formed by heating on a lithographic printing plate precursor according to the present invention. Specifically, an image is recorded by direct imaging with a heat-recording head, scanning exposure with an infrared laser, high intensity flash exposure by a xenon discharge lamp, etc., and infrared lamp exposure. Exposure by solid state high output infrared lasers such as semiconductor lasers emitting infrared rays of wavelength of from 700 to 12,000 nm and YAG lasers is preferred in the present invention.

An image-exposed lithographic printing plate precursor according to the present invention can be loaded on a printing machine without requiring any further process. On entering into printing using ink and a fountain solution, the overcoat layer is removed by the fountain solution and at the same time the hydrophilic layer at the exposed area is also removed, ink adheres to the ink-receptive layer under the hydrophilic layer and printing begins.

EXAMPLES

The present invention is more specifically described below with referring to examples, but it should not be construed as the present invention is limited thereto.

Examples 1 to 4 and Comparative Examples 1 and 2

Preparation of Aluminum Substrate

A rolled plate having a thickness of 0.24 mm of JIS-A-1050 aluminum containing 99.5 wt % of aluminum, 0.01 wt % of copper, 0.3 wt % of iron, 0.03 wt % of titanium, and 0.1 wt % of silicon was surface-grained with a 20 wt % aqueous suspension of 400 mesh purmice stone (manufactured by Kyoritsu Yogyo Co., Ltd.) and a rotary nylon brush, and then the plate was thoroughly washed with water. The plate was immersed in a 15 wt % aqueous solution of sodium hydroxide (containing 4.5 wt % of aluminum) and etched so as to reach the dissolving amount of the aluminum of 5 $g/m^2$, then washed with flowing water, followed by neutralization with a 1 wt % aqueous solution of nitric acid. Subsequently, the plate was subjected to electrolytic roughening treatment in a 0.7 wt % aqueous solution of nitric acid (containing 0.5 wt % of aluminum) using rectangular alternating wave form voltage (electric current ratio r=0.90, electric current wave form disclosed in JP-B-58-5796) of the anode time voltage of 10.5 V and the cathode time voltage of 9.3 V, with the quantity of electricity of the anode time of 160 $C/dm^2$. After washing with water, the plate was immersed in a 10 wt % aqueous solution of sodium hydroxide at 35° C. and etched so as to reach the dissolving amount of the aluminum of 1 $g/m^2$, and then washed with water. The plate was then immersed in a 30 wt % aqueous solution of sulfuric acid at 50° C., desmutted, and washed with water. Further, the plate was subjected to anodizing treatment in a 20 wt % aqueous solution of sulfuric acid (containing 0.8 wt % aluminum) at 35° C. using direct current. That is, electrolysis was performed at electric current density of 13 $A/dm^2$, and substrates having an anodic oxide film weight of 2.0 $g/m^2$ and 4.0 $g/m^2$ were obtained by controlling the electrolysis time.

The thus-obtained substrates were subjected to sealing treatment in a saturated steam chamber at 100° C. 1 atm with varying treatment time as shown in Table 1 below, thus supports having different sealing rates were prepared.

Coating of Ink-Receptive Layer

Coating solution A-1 for an ink-receptive layer having the composition shown below was coated on each of the above-prepared supports with a bar coater in a coating amount of 12 $ml/m^2$. The coated layer was then dried at 100° C. for 1 minute, thus each aluminum substrate having an ink-receptive layer of a dry coating weight of about 0.5 $g/m^2$ was prepared.

| Ink-receptive layer-coating solution A-1 | |
|---|---|
| Organic high polymer (1) | 3 g |
| γ-Butyrolactone | 9.5 g |
| Methyl lactate | 3 g |
| Methyl ethyl ketone | 22.5 g |
| Propylene glycol monomethyl ether | 22 g |

Organic high polymer (1) is an N-(p-aminosulfonylphenyl)methacrylamide/ethyl methacrylate/acrylonitrile (32/43/25 in molar ratio) copolymer, the synthesis method of which is disclosed in JP-A-11-44956.

Coating of Hydrophilic Layer

Coating solution B-1 for a hydrophilic layer having the composition shown below was coated on the thus-provided ink-receptive layer and the coated layer was then dried at 100° C. for 1 minute, thus a heat-sensitive lithographic printing plate precursor having a hydrophilic layer of a dry coating weight of 1 $g/m^2$ was prepared.

| Hydrophilic layer-coating solution B-1 | |
|---|---|
| A 10 wt % methanol solution of poly-2-hydroxyethyl methacrylate (weight average molecular weight: 300,000) | 1 g |
| Methanol silica (a colloidal silica comprising a methanol solution containing 30 wt % of silica, | 3 g |

-continued

| Hydrophilic layer-coating solution B-1 | |
|---|---|
| silica particle size: from 10 to 20 nm, manufactured by Nissan Chemical Industries, Ltd.) | |
| Compound capable of converting light into heat (exemplified dye IR-11) | 0.09 g |
| Methyl lactate | 1.5 g |
| Methanol | 14.5 g |

The above heat-sensitive lithographic printing plate precursor was subjected to exposure using Trendsetter (a plate setter mounting an 830 nm semiconductor laser, 40 W, manufactured by Creo Co., Ltd.). The exposed precursor was mounted on a printing machine "Lithron" (manufactured by Komori Corporation) without further treatment, and printing was performed using a fountain solution comprising a plate etching solution EU-3 ((manufactured by Fuji Photo Film Co., Ltd.)/water/isopropyl alcohol (volume ratio of 1/99/10) and Geos G black ink (manufactured by Dai-Nippon Ink & Chemicals Inc.). The optimal quantity of exposure energy (sensitivity) was found from the result and shown in Table 1 below. Further, the printable number of sheets (press life) when exposure was performed by the above optimal quantity of exposure energy and the result of the observation of printing staining were also shown in Table 1.

TABLE 1

| Example No. | Amount of Anodic Oxide Film ($g/m^2$) | Sealing Treatment: Time of Treatment (sec.) | Sealing Treatment: Sealing Rate (%) | Sensitivity ($mJ/m^2$) | Press Life (number of sheets) | Staining |
|---|---|---|---|---|---|---|
| Example 1 | 2.0 | 12 | 50 | 350 | 10,000 | Good |
| Example 2 | 2.0 | 50 | 100 | 300 | 10,000 | Good |
| Example 3 | 4.0 | 15 | 50 | 300 | 10,000 | Good |
| Example 4 | 4.0 | 50 | 100 | 270 | 10,000 | Good |
| Comparative Example 1 | 2.0 | 0 | 0 | 400 | 10,000 | Good |
| Comparative Example 2 | 4.0 | 0 | 0 | 400 | 10,000 | Good |

Example 5, Comparative Example 3

An aluminum support having an anodic oxide film weight of 2.7 $g/m^2$, sealing treatment time of 50 seconds and a sealing rate of 100% was prepared according to the same treatment as in Example 1. The same ink-receptive layer as in Example 1 was provided on the support, and hydrophilic layer-coating solution B-2 having the composition shown below was coated on the ink-receptive layer to thereby provide a hydrophilic layer having a dry coating weight of 1.0 $g/m^2$.

| Hydrophilic layer-coating solution B-2 | |
|---|---|
| A 10 wt % methanol solution of poly-2-hydroxyethyl methacrylate (the same as in Example 1) | 1 g |
| Methanol silica (the same as in Example 1) | 3 g |
| Methyl lactate | 1.5 g |
| Methanol | 14.5 g |

Coating solution OC-1 for an overcoat layer having the composition shown below was coated on the above hydrophilic layer and the coated layer was dried at 100° C. for 90 seconds, thus a heat-sensitive lithographic printing plate precursor having an overcoat layer of a dry coating weight of 0.5 g/$m^2$ was prepared.

| Overcoat layer-coating solution OC-1 | |
|---|---|
| Polyacrylic acid (weight average molecular weight: 50,000) | 1.0 g |
| Compound capable of converting light into heat (exemplified dye IR-11) | 0.2 g |
| Polyoxyethylenenonylphenyl ether | 0.04 g |
| Water | 19 g |

The above-prepared heat-sensitive lithographic printing plate precursor was subjected to exposure in the same manner as in Example 1 and printing was performed. The optimal quantity of exposure energy was 270 mJ/$m^2$ and 10,000 sheets of good printed matters could be obtained.

A heat-sensitive lithographic printing plate precursor prepared in the same manner as in Example 5 except for omitting the sealing treatment (Comparative Example 3) showed that the optimal quantity of exposure energy was 450 mJ/$m^2$ and the press life was 10,000 sheets.

Example 6

A hydrophilic layer having a dry coating weight of 1.0 g/$m^2$ was provided using hydrophilic layer-coating solution B-3 having the composition shown below on the aluminum support having the same ink-receptive layer as prepared in Example 5.

| Hydrophilic layer-coating solution B-3 | |
|---|---|
| Novolak resin (N1) | 0.05 g |
| Methanol silica | 3 g |
| Compound capable of converting light into heat (exemplified dye IR-11) | 0.09 g |
| Methyl lactate | 1.5 g |
| Methanol | 14.5 g |

Novolak resin (N1) is an addition condensation product of a mixture of m-cresol and p-cresol in weight ratio of 6/4 with paraformaldehyde and has a weight average molecular weight of 3,500.

The optimal quantity of exposure energy of this heat-sensitive lithographic printing plate precursor was 270 mJ/$m^2$ and 10,000 sheets of good printed matters could be obtained.

Example 7

A heat-sensitive lithographic printing plate precursor having an overcoat layer containing a compound capable of converting light into heat was prepared in the same manner as in Example 6 except that hydrophilic layer-coating solution B-3 was replaced with hydrophilic layer-coating solution B-4.

| Hydrophilic layer-coating solution B-4 | |
|---|---|
| Novolak resin (N1) | 0.05 g |
| Glassca 401 (Ceramica G-401) | 4.5 g |
| Methyl lactate | 1.5 g |
| Methanol | 13 g |

Glassca 401 is a 20 wt % methanol colloidal solution comprising $ZrO_2$.$SiO_2$ manufactured by Hichiban Kenkyusho Co.

The above-prepared heat-sensitive lithographic printing plate precursor was subjected to exposure in the same manner as in Example 1 and printing was performed. The optimal quantity of exposure energy was 270 mJ/$m^2$ and 10,000 sheets of good printed matters could be obtained.

Example 8

An ink-receptive layer having a dry coating weight of 0.5 g/$m^2$ was provided using ink-receptive layer-coating solution IA-2 containing a compound capable of converting light into heat having the composition shown below on the same aluminum support as used in Example 5 having an anodic oxide film weight of 2.7 g/$m^2$ and a sealing rate of 100%.

| Ink-receptive layer coating solution IA-2 | |
|---|---|
| Polyvinyl formal resin (Denka Formal #200, manufactured by Electro Chemical Industry Co., Ltd.) | 3.0 g |
| Megafac F-177 (fluorine-containing surfactant, manufactured by Dai-Nippon Ink & Chemicals Inc.) | 0.04 g |
| Compound capable of converting light into heat (exemplified dye IR-24) | 0.3 g |
| Methyl ethyl ketone | 37 g |
| Propylene glycol monomethyl ether | 20 g |

A hydrophilic layer having a dry coating weight of 1 g/$m^2$ was provided using hydrophilic layer-coating solution B-5 having the composition shown below on the above support. Overcoat layer coating solution OC-2 having the composition shown below was coated on the above hydrophilic layer, thus a heat-sensitive lithographic printing plate precursor having an overcoat layer of a dry coating weight of 0.5 g/$m^2$was prepared.

| Hydrophilic layer-coating solution B-5 | |
|---|---|
| Novolak resin (N1) | 0.05 g |
| Methanol silica | 3 g |
| Methyl lactate | 1.5 g |
| Methanol | 13 g |

| Overcoat layer-coating solution OC-2 | |
|---|---|
| Polyacrylic acid (weight average molecular weight: 25,000) | 1.0 g |
| Polyoxyethylenenonylphenyl ether | 0.025 g |
| Water | 19 g |

The above-prepared heat-sensitive lithographic printing plate precursor was subjected to exposure in the same manner as in Example 1 and printing was performed. The optimal quantity of exposure energy was 270 mJ/$m^2$ and 10,000 sheets of good printed matters could be obtained.

EFFECT OF THE INVENTION

Accordingly, a heat-sensitive lithographic printing plate precursor having an aluminum support which can be directly mounted on a printing machine without development processing after exposure to effect printing and improved in sensitivity can be obtained according to the present invention.

While the invention has been described in detail and with reference to specific examples thereof, it will be apparent to one skilled in the art that various changes and modifications can be made therein without departing from the spirit and scope thereof.

What is claimed is:

1. A heat-sensitive lithographic printing plate precursor which comprises an aluminum support having provided thereon an ink-receptive layer, a hydrophilic layer containing a collodial particle oxide or hydroxide of at least one element selected from the group of beryllium, magnesium, alluminum, silicon, titanium, boron, germanium, tin, zirconium, iron, vanadium, antimony and transistion metals, and a water-soluble overcoat layer, wherein at least one layer of the ink-receptive layer, the hydrophilic layer and the water-soluble overcoat layer contains a compound capable of converting light into heat, the aluminum support has an anodic oxide film in the amount of 2 $g/m^2$ or more, and the anodic oxide film has been subjected to a sealing treatment at a sealing rate of 50% or more.

2. The heat-sensitive lithographic printing plate precursor of claim 1, wherein the aluminum support has a thickness of from 0.05 to 0.6 mm.

3. The heat-sensitive lithographic printing plate precursor of claim 1, wherein the ink-receptive layer has a dry thickness of 0.1 $\mu$m or more.

4. The heat-sensitive lithographic printing plate precursor of claim 1, wherein the hydrophilic layer has a thickness of from 0.1 to 3.0 $\mu$m.

5. The heat-sensitive lithographic printing plate precursor of claim 1, wherein the water-soluble overcoat layer has thickness of from 0.05 to 4.0 $\mu$m.

6. The heat-sensitive lithographic printing plate precursor of claim 1, wherein when the compound capable of converting light into heat is added to the ink-receptive layer, the addition rate of the compound is 20 wt % or less of the solid contents in the ink-receptive layer, when the compound capable of converting light into heat is added to the hydrophilic layer, the addition rate of the compound is from 1 to 40 wt % of the solid contents in the hydrophilic layer, and when the compound capable of converting light into heat is added to the water-soluble overcoat layer, the addition rate of the compound is from 1 to 70 wt % of the solid contents in the overcoat layer.

* * * * *